United States Patent
Gold (10) Patent No.: US 6,173,577 B1
(45) Date of Patent: Jan. 16, 2001

(54) METHODS AND APPARATUS FOR COOLING SYSTEMS FOR CRYOGENIC POWER CONVERSION ELECTRONICS

(75) Inventor: Calman Gold, Londonderry, NH (US)

(73) Assignee: American Superconductor Corporation, Westborough, MA (US)

( * ) Notice: Under 35 U.S.C. 154(b), the term of this patent shall be extended for 0 days.

(21) Appl. No.: 09/294,474

(22) Filed: Apr. 20, 1999

Related U.S. Application Data (63) Continuation-in-part of application No. 09/218,836, filed on Dec. 22, 1998, now abandoned, which is a continuation of application No. 08/698,806, filed on Aug. 16, 1996, now Pat. No. 6,023,934.

(51) Int. Cl.⁷ ..................................................... F25B 19/00
(52) U.S. Cl. ............................................ 62/51.1; 62/259.2
(58) Field of Search ...................................... 62/51.1, 259.2

(56) References Cited

U.S. PATENT DOCUMENTS

| | | |
|---|---|---|
| 3,021,683 | 2/1962 | McInroy . |
| 3,048,021 | 8/1962 | Coles et al. . |
| 3,320,755 | 5/1967 | Jepsen et al. . |

(List continued on next page.)

FOREIGN PATENT DOCUMENTS

| | | |
|---|---|---|
| 0 419 042 A1 | 3/1991 | (EP) . |
| 0 419 042 B1 | 3/1991 | (EP) . |
| 0 492 777 A2 | 7/1992 | (EP) . |
| 0 492 777 B1 | 7/1992 | (EP) . |
| 0 507 275 A1 | 10/1992 | (EP) . |
| 0 516 093 B1 | 12/1992 | (EP) . |
| 0 552 075 A1 | 7/1993 | (EP) . |
| 0 552 075 B1 | 7/1993 | (EP) . |
| 0 554 966 A2 | 8/1993 | (EP) . |
| 0 564 653 A1 | 10/1993 | (EP) . |
| 0 565 265 A1 | 10/1993 | (EP) . |
| 0 568 115 B1 | 11/1993 | (EP) . |
| 0 621 328 A1 | 10/1994 | (EP) . |
| 0 632 002 A1 | 1/1995 | (EP) . |
| 0 565 265 B1 | 10/1995 | (EP) . |
| 0 676 459 A1 | 10/1995 | (EP) . |
| 0 676 460 A1 | 10/1995 | (EP) . |
| WO 96/24939 | 8/1996 | (WO) . |
| WO 98/07306 | 2/1998 | (WO) . |

OTHER PUBLICATIONS

York, "Heating Cryogenic Helium with a Solid Propellant Gas Generator", pp. 759–766, Proc. of the 1983 Cryogenic Eng. Conf., Colorado Springs, CO., (Aug. 15–17, 1983), Advances in Cryogenic Engineering, vol. 29, Fast, Ed., (1984).

Barron, "Cryogenics Systems", Oxford Univ. Press, New York, Clarendon Press, Oxford, pp. 150–237, 356–429 (1985).

Bell, Jr., "Cryogenic Engineering", Prentice–Hall, Inc., Englewood Cliffs, N.J., pp. 276–311 (1963).

Timmerhaus et al., "Cryogenic Process Engineering", Plenum Press, NY & London, pp. 1–9, 407–421 (1989).

*Primary Examiner*—Ronald Capossela
(74) *Attorney, Agent, or Firm*—Choate, Hall & Stewart (57) ABSTRACT

Methods and apparatus for cooling systems for cryogenic power conversion electronics are provided. The invention includes systems having electronic power conversion apparatus comprising at least one cryogenically operated semiconductor switch and at least one cryogenically operated capacitor and cooling means for cryogenically cooling the at least one cryogenically operated semiconductor switch and the at least one cryogenically operated capacitor to a temperature between 90K to 236K. The systems can also include input/output means for supplying power to said power conversion apparatus and receiving power from said power conversion apparatus. In alternative embodiments, liquid cryogens can be used in heat exchange systems in conjunction with refrigeration cold heads or heat pipes. In these embodiments, the cryogen can be recondensed if boiled.

20 Claims, 4 Drawing Sheets

U.S. PATENT DOCUMENTS

| | | |
|---|---|---|
| 3,714,796 | 2/1973 | Longsworth . |
| 3,728,868 | 4/1973 | Longsworth . |
| 4,237,699 | 12/1980 | Longsworth et al. . |
| 4,366,389 | 12/1982 | Hussey . |
| 4,369,120 | 1/1983 | Stelz et al. . |
| 4,436,641 | 3/1984 | Stelz et al. . |
| 4,460,834 | 7/1984 | Gottfried . |
| 4,465,943 | 8/1984 | Risberg . |
| 4,473,756 | 9/1984 | Brigden et al. . |
| 4,484,084 | 11/1984 | Cheffer . |
| 4,488,057 | 12/1984 | Clarke . |
| 4,653,284 | 3/1987 | Steyert . |
| 4,673,825 | 6/1987 | Raddi et al. . |
| 4,675,538 | 6/1987 | Epstein . |
| 4,781,033 | 11/1988 | Steyert et al. . |
| 4,827,152 | 5/1989 | Farkas . |
| 4,939,633 | 7/1990 | Rhodes et al. . |
| 4,970,868 | 11/1990 | Grebe et al. . |
| 5,038,571 | 8/1991 | Yokouchi et al. . |
| 5,053,635 | 10/1991 | West . |
| 5,057,697 | 10/1991 | Hammond et al. . |
| 5,108,637 | 4/1992 | Pearson . |
| 5,126,585 | 6/1992 | Boys . |
| 5,172,009 | 12/1992 | Mohan . |
| 5,210,685 | 5/1993 | Rosa . |
| 5,220,492 | 6/1993 | Rubin et al. . |
| 5,229,650 | 7/1993 | Kita et al. . |
| 5,236,611 | 8/1993 | Shiflett . |
| 5,248,433 | 9/1993 | Felix et al. . |
| 5,254,279 | 10/1993 | Takemasa et al. . |
| 5,277,834 | 1/1994 | Bivens et al. . |
| 5,307,641 | 5/1994 | Kooy . |
| 5,315,533 | 5/1994 | Stich et al. . |
| 5,334,877 | 8/1994 | Mohan et al. . |
| 5,347,168 | 9/1994 | Russo . |
| 5,465,011 | 11/1995 | Miller et al. . |
| 5,474,695 | 12/1995 | Macaudiere et al. . |

METHODS AND APPARATUS FOR COOLING SYSTEMS FOR CRYOGENIC POWER CONVERSION ELECTRONICS

This application claims the priority to and is a continuation-in-part of U.S. patent application Ser. No. 09/218,836, filed Dec. 22, 1998, now abandoned, which application is a continuation of U.S. patent application Ser. No. 08/698,806, filed Aug. 16, 1996, now U.S. Pat. No. 6,023,834, both of which are incorporated herein by reference.

TECHNICAL FIELD

The present invention generally relates to methods and apparatus for cooling systems for use with cryogenic power conversion electronics. The invention more particularly relates to methods and apparatus for cooling systems for use with cryogenic power conversion electronics in which the cryogenic power conversion electronics are maintained in a temperature range of 90K to 236K within the cooling system.

BACKGROUND OF THE INVENTION

Cryogenics relates to the production and maintenance of very low temperatures, often using cryogenic fluids such as hydrogen, helium, oxygen, nitrogen, air or methane. Various discussions concerning cryogenic systems can be found in literature. See, e.g., Barron, *Cryogenic Systems,* 2d Ed., Oxford University Press (1985); Bell, Jr., *Cryogenic Engineering,* Prentice Hall, Inc. (1963); Vance, *Cryogenic Technology,* John Wiley & Sons, Inc. (1963); and Timmerhaus et al, *Cryogenic Process Engineering,* Plenum Press (1989).

U.S. Pat. Nos. 3,320,755; 3,714,796 and 3,728,868 disclose cryogenic refrigeration systems (i.e., cryostats). U.S. Pat. No. 4,237,699 relates to cryostats for producing cryogenic refrigeration by expansion of a working fluid through a Joule-Thomson orifice. The cryostat disclosed in U.S. Pat. No. 4,237,699 can be placed in a dewar so that the liquefied working fluid can be maintained to cool an object such as an infrared detector. U.S. Pat. Nos. 3,021,683 and 3,048,021 relate to gas liquefiers. U.S. Pat. No. 4,653,284 discloses a Joule-Thomson heat exchanger and cryostat. U.S. Pat. No. 4,781,033 discloses a heat exchanger for a fast cooldown.

Prior to and as a result of the discovery of high temperature superconductors (HTS), a significant amount of time and money has been spent to evaluate the operating characteristics of circuit components at low temperatures. For example, advantages have been observed when operating power MOSFETs at 77K. These advantages include a reduction of the on-resistance of the MOSFETs by as much as a factor of 30 at 77K.

The implementation of cryocooled electronic power conversion apparatus incorporating MOSFETs and HTS (high temperature superconductor) magnetics, however, has been directed at operational temperatures of 77K and lower. This is due in part to operational features of the HTS wire. A temperature of 77K has been achieved by operating the electronic circuitry in a bath of liquid nitrogen.

U.S. Pat. No. 5,347,168 to Russo discloses a high performance, cryogenically cooled circuit. The entire circuit, as opposed to for example only the superconducting portions of the circuit, are refrigerated to cryogenic temperatures. In addition to the improved operational characteristics of the superconducting based components, the diodes and the gating elements such as MOSFETs provide a circuit capable of operating a switching power supply at lower frequency using larger inductor values. The entire contents of U.S. Pat. No. 5,347,168 are incorporated herein by reference.

While the cryogenic electronics power supplies and power sinks disclosed in U.S. Pat. No. 5,347,168 represent a significant improvement over the prior art, the economics of large scale commercial products employing cryogenic power conversion electronics suggest that overall system and cost efficiency can be more easily met by operating the power electronics at temperatures in the range of 90K to 236K.

It would therefore be desirable to provide methods and apparatus for cryogenic cooling systems that allow operation in a temperature range of 90K to 236K, thereby overcoming the shortcomings associated with the prior art.

SUMMARY OF THE INVENTION

It is an object of the present invention to provide methods and apparatus for cryogenically cooling electronic power conversion apparatus in the temperature range of 90K to 236K, and preferably in the range of 150K to 170K.

It is another object of the present invention to provide cryogenic cooling systems that operate in the range of 90K to 236K and that include a chemically inert liquid cryogen.

It is another object of the present invention to provide cryogenic cooling systems that operate in the range of 90K to 236K and that include a nontoxic liquid cryogen.

It is another object of the present invention to provide cryogenic cooling systems that operate in the range of 90K to 236K and that include an environmentally attractive liquid cryogen.

It is another object of the present invention to provide cryogenic cooling systems that operate in the range of 90K to 236K and that include a dielectric cryogenic liquid heat transfer medium exhibiting acceptable heat transfer properties.

It is another object of the present invention to provide cryogenic cooling systems that operate in the range of 90K to 236K and that include a non-flammable liquid cryogen.

It is another object of the present invention to provide cryogenic cooling systems that operate in the range of 90K to 236K and that include a non-ozone deleting liquid cryogen.

It is yet another object of the present invention to provide cryogenic cooling systems that operate in the range of 90K to 236K and that include octafluoropropane (perfluoropropane).

It is yet another object of the present invention to provide cryogenic cooling systems that operate in the range of 90K to 236K and that include fully fluorinated 5-carbon branched and straight-chain molecules (e.g., perfluoro n-pentane, 2-trifluoromethyl-1,1,1,2,3,3,4,4,4-nonfluorobutane (trifluoromethyl perfluoro n-butane), tetra(trifluoromethyl) methane (perfluoroisopentane), and other isomers).

It is another object of the present invention to provide cryogenic cooling systems that operate in the range of 90 K to 236K and that include fully fluorinated 6-carbon branched and straight-chain molecules (e.g., tetradecafluorohexane (perfluoro n-hexane), trifluoromethyl perfluoro n-pentane, di(trifluoromethyl) perfluoro n-butane, and other isomers).

It is another object of the present invention to provide cryogenic cooling systems that operate in the range of 90K to 236K and that include fully fluorinated 7-carbon branched and straight-chain molecules (e.g., perfluoro n-heptane, trifluoromethyl perfluoro n-hexane, di(trifluoromethyl) perfluoro n-pentane, tri(trifluoromethyl) perfluoro n-butane, and other isomers).

It is yet another object of the present invention to provide cryogenic cooling systems that operate in the range of 90K to 236K and that include a mixture of fully fluorinated straight or branched-chain alkanes.

These and other objects of the invention are provided by methods and apparatus that include a cryogenic cooling system employing as a liquid cryogen an inert, dielectric, nonflammable, non-ozone depleting material operating in the temperature range of 90K to 236K. In preferred embodiments of the invention, the liquid cryogen is a fluorocarbon such as a fluoroalkane operating at temperatures between 90K and 236K. Preferably, the fluorocarbon does not contain any chlorine. Exemplary fluoroalkanes suitable for use in the invention include, but are not limited to, octafluoropropane (perfluoropropane), decafluoro n-butane (perfluoro n-butane), decafluoro isobutane (perfluoro isobutane), fluoroethane (e.g., between its boiling and melting points), hexafluoropropane, heptafluoropropane (e.g., 1,1,1,2,3,3,3-heptafluoropropane and 1,1,1,2,2,3,3-heptafluoropropane) and isomers and mixtures thereof. Preferably, the liquid cryogen is saturated and completely halogenated such that the formation of hydrogen fluoride (HF) in the event of an electrical arc is minimized. The temperature of the liquid cryogen can be maintained by a cryogenic refrigeration system with associated controls, cold heads, and heat exchangers.

The liquid cryogen may not exhibit nucleate boiling unless a critical heat flux is reached. Under normal conditions below boiling, the liquid will act as a thermal convective heat transfer medium for dissipative power electronic assemblies and components, and is suitable for a number of heat exchange configurations in which the average bulk temperature can be controlled. In a heat exchange configuration, heat may be extracted from the perfluoropropane or perfluoropropane mixture by immersion of a cold head from a cryogenic cooler or by immersion of a conduit through which passes a cryogenic liquid or vapor at a suitably lower temperature.

In another embodiment, the liquid cryogen can be used as the heat transfer medium in a heat pipe structure. In this embodiment, heat extracted from the dissipative electronic assembly is extracted at the boiling point temperature of the liquid cryogen and the cryogen is recondensed by a cold head sink at the other end of the heat pipe.

The foregoing has outlined some of the more pertinent objects of the present invention. These objects should be construed to be merely illustrative of some of the more prominent features and applications of the invention. Many other beneficial results can be attained by applying the disclosed invention in a different manner of modifying the invention as will be described. Accordingly, other objects and a fuller understanding of the invention may be had by referring to the following Detailed Description of the Preferred Embodiments.

BRIEF DESCRIPTION OF THE DRAWINGS

For a fuller understanding of the present invention, reference is had to the following description taken in conjunction with the accompanying drawings, in which.

Similar reference characters refer to similar parts throughout the several views of the drawings.

DETAILED DESCRIPTION OF THE PREFERRED EMBODIMENTS

As discussed above, implementation of cryocooled electronic power conversion apparatus including for example MOSFETs and HTS (high temperature superconductor) magnetics has been directed at operational temperatures of 77K and lower. This has been due in part to operational features of the HTS wire. A temperature of 77K has been achieved by operating the electronic circuitry in a bath of liquid nitrogen.

Overall system efficiency and cost effectiveness, however, can be more easily achieved by operating electronic power conversion apparatus (with or without HTS) at temperatures in the range of 90K to 236K, and preferably in the range of 150K to 170K. This may be attributable to the higher COP (coefficient of performance) and lower cost of high capacity heat pumps operating at these higher temperatures as compared with those operating at 77K. A significant problem in being able to operate at these higher temperatures has been the selection of a suitable liquid cryogen that is inert, nontoxic and environmentally safe at these temperatures. In addition, the cryogen should be a dielectric and exhibit acceptable liquid heat transfer medium characteristics. The most common available substances which exhibit liquid behavior in the temperature range between 90K and 200K are corrosive, flammable, or toxic, e.g., methane, ethane, fluorine, nitric oxide, ethylene, $CClF_3$ and restricted refrigerants exhibiting ozone-depleting properties.

The present invention includes a cryogenic cooling system for use with electronic power conversion apparatus. The system employs a liquid cryogen that is operable in the temperature range of 90K to 236K and that is non-flammable, dielectric, non-toxic, stable, and chemically inert and exhibits near zero ozone depletion potential. In preferred embodiments of the invention, the liquid cryogen is a fluorocarbon such as a fluoroalkane operating at temperatures between 100K and 236K. Preferably, the fluorocarbon does not contain any chlorine. Exemplary fluoroalkanes suitable for use in the invention include, but are not limited to, octafluoropropane (perfluoropropane), decafluoro n-butane (perfluoro n-butane), decafluoro isobutane (perfluoro isobutane), fluoroethane, hexafluoropropane, heptafluoropropane (e.g., 1,1,1,2,3,3,3-heptafluoropropane and 1,1,1,2,2,3,3-heptafluoropropane), perfluoro n-pentane, trifluoromethyl butane, perfluoro isopentane, perfluoro n-hexane, trifluoromethyl perfluoro npentane, di(trifluoromethyl) perfluoro n-butane, perfluoro n-heptane, trifluoromethyl perfluoro n-hexane, di(trifluoromethyl) perfluoro n-pentane, tri(trifluoromethyl) perfluoro n-butane, and isomers and mixtures thereof. The prefix "perfluoro" indicates that the only substituents on the carbon chain are fluorines and other alkyl groups described in the molecule's name.

Preferably, the liquid cryogen is saturated and completely halogenated such that the formation of hydrogen fluoride (HF) is minimized. The temperature of the liquid cryogen can be maintained by a cryogenic refrigeration system with associated controls, cold heads, and heat exchangers. It will be appreciated, however, that the invention is not limited to such cryogens.

For example, other cryogens and mixtures of cryogens that exhibit the characteristics mentioned above are suitable for use in accordance with the invention. In addition, appropriate combination in a mixture allows both the boiling point and the freezing point to be adjusted to suit the physical property requirements of a cooling system in a specified temperature range.

As mentioned above, octafluoropropane ($C_3F_8$) and other fluorinated alkanes are suitable for use as a cryogen in accordance with the present invention. Fully fluorinated alkanes are inert, dielectric, nonflammable, and non-ozone depleting. Octafluoropropane is a gas which at 1 atmosphere of pressure exhibits a boiling point of 236K and exhibits a pour point of 90K. When octafluoropropane is utilized as the cryogen, it is preferred that the operating temperature of the system is at least 100K. Decafluoro n-butane ($C_4F_{10}$) exhibits similar properties to those of octafluoropropane, but exhibits a boiling point of 271K and a pour point of 145K at 1 atmosphere. Octafluoropropane ($C_3F_8$) and decafluoro n-butane ($C_4F_8$) are commercially available from 3M™ under the trade names PF-5030 and PF-5040 (available as a mixture of isomers), respectively. Octafluoropropane ($C_3F_8$) is sometimes referred to as R218 or FC218. Perfluoropentane ($C_5F_{12}$) exhibits a boiling point of 30° C. and a pour point of –115° C. (158K) at 1 atm. pressure. It is available as a mixture of isomers from 3M™ as PF-5050 and is also known as FC-87 Fluorinert. Perfluorohexane ($C_6F_{14}$) and perfluoroheptane ($C_7F_{16}$) are both liquids at room temperature. Perfluorohexane exhibits a boiling point of 58° C. and a pour point of –90° C. (183K) and is sold by 3M™ as a mixture of isomers as PF-5060 and is also known as FC-72 Fluorinert. Perfluoroheptane exhibits a boiling point of 80° C. and a pour point of –95° C. (178K) and is sold as a mixture of isomers by 3M™ as PF-5070 and is also know as FC-84 Fluorinert. In the following description, octafluoropropane is sometimes used to refer to the cryogen. This is intended for purposes of illustration and is not to be construed as limiting. It will be appreciated that other cryogens having the characteristics discussed above can be utilized in accordance with the present invention.

Figure 1A:
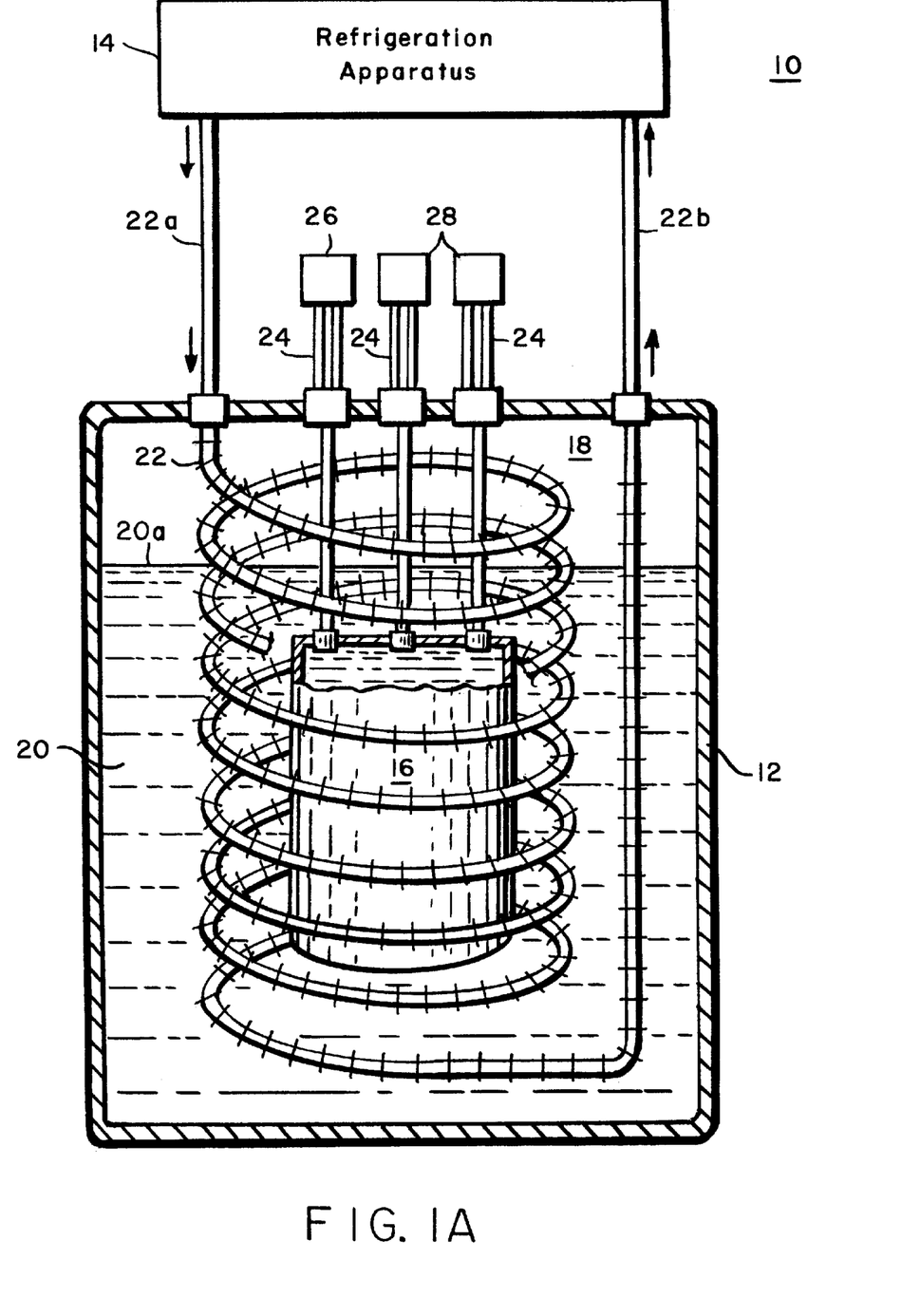
FIG. 1A illustrates a cryogenic cooling system suitable for use in accordance with the present invention.

Referring now to FIG. 1A, a cryogenic cooling system suitable for use in accordance with the present invention is illustrated. Cooling system 10 includes an insulated pressure vessel 12, refrigeration apparatus 14 and electronic power conversion apparatus 16. Cryogenic electronics power supplies and power sinks suitable for use in accordance with the present invention include those disclosed in commonly owned U.S. Pat. Nos. 5,347,168; 5,612,615 and 5,801,937. The entire contents of U.S. Pat. Nos. 5,347,168; 5,612,615 and 5,801,937 are incorporated herein by reference. Other electronic power conversion apparatus that are cryogenically operated can be used in the present invention. For example, electronic power conversion apparatus can contain at least one cryogenically operated semiconductor switch and at least one cryogenically operated capacitor, although it may not always be necessary to include the capacitor. System 10 also includes cooling coils 22, feed through connectors 24, power source 26 and power sink(s) 28.

Vessel 12 can be a dewar or the like. Liquid cryogen 20 is contained within vessel 12 such that sufficient vapor space 18 is provided. Electronic power conversion apparatus 16 is cryogenically cooled and maintained at a temperature between 90K and 236K in vessel 12 by liquid cryogen 20.

Liquid cryogen 20 may not exhibit nucleate boiling unless a critical heat flux is reached. Under normal conditions below the normal boiling point, liquid cryogen 20 will act as a thermal convective heat transfer medium for dissipative power electronic conversion apparatus 16 and is suitable for various heat exchange configurations in which the average bulk temperature can be controlled.

Under some circumstances, cryogen 20 may reach a boiling point during operation such that vapor forms in vapor space 18. Cryogen 20 is cooled by refrigeration apparatus 14. For example, cooling coils 22 can be provided to cool cryogen 20 in vessel 12. Preferably, cooling coils 22 are finned to increase the surface area for heat transfer from the cryogen to the refrigeration coil. It will be appreciated that alternative configurations for the cooling coils can be employed so long as the desired heat transfer characteristics from the cryogen to the refrigeration coil can occur. As also shown in FIG. 1A, coils 22 are connected to refrigeration apparatus 14 as indicated by lines 22a and 22b. In this manner, cryogen 20 can be maintained within a temperature range of 90K to 236K and preferably in a range of 140K to 170K.

As further shown in FIG. 1A, a portion of the coils 22 is positioned to be above the cryogen surface level 20a, i.e. in the vapor space 18. When the system 10 is not in use, cryogen 20 is a gas and vapor thus forms in vapor space 18. During start-up and the like, the portion of coils 22 in vapor space 18 provide cooling of the cryogen vapor.

Feed through connectors 24 are connected to electronic power conversion apparatus 16 in a manner such that a power source 26 can deliver power to apparatus 16 and such that connections for sinking power to a load 28 are provided. Feed through connectors 24 have pressure seals contained therein to accommodate temperature changes. Such changes can occur for example during shipping or the like. More specifically, when a system 10 is shipped, the cryogen may be in a gaseous state. The pressure seals are configured to accommodate vapors from the cryogen.

The embodiment shown in FIG. 1A is operated at atmospheric pressure such that cryogen 20 exhibits its normal boiling point and heat is transferred primarily by convection and conduction. In this embodiment, liquid cryogen 20 can blanketed by a space of dry nitrogen and sealed at 1 atm. In an alternative embodiment of the invention illustrated in FIG. 1B, system 10 can be operated in a manner such that the contents in cryostat 12 operate under reduced pressure (e.g., 0.1 atm), and in which the apparatus functions primarily as a distillation apparatus. For instance, cryogen 20 is locally boiled at lower than its normal boiling point with the coil 22 above the liquid level 20a serving as a reflux condenser. The heat transfer in this embodiment utilizes the latent heat of vaporization (i.e., the change in enthalpy required to boil the liquid to a vapor) at a specified temperature and pressure. The refluxed liquid may be subcooled relative to the boiling point, thereby requiring additional enthalpy change to first heat the liquid to its boiling point.

Figure 1B:
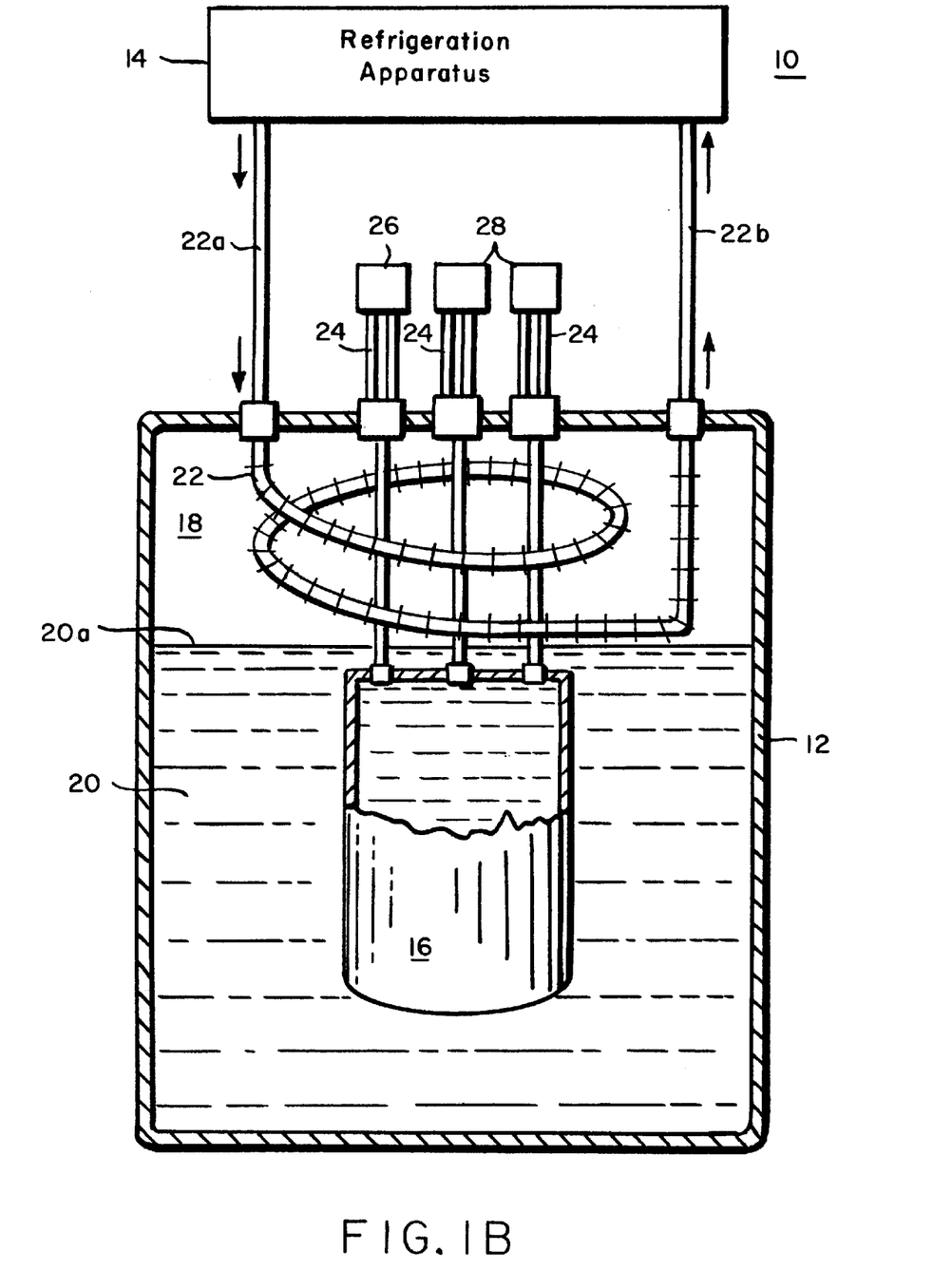
FIG. 1B illustrates a cryogenic cooling system suitable for use in accordance with an alternative embodiment of the present invention.
Figure 1C:
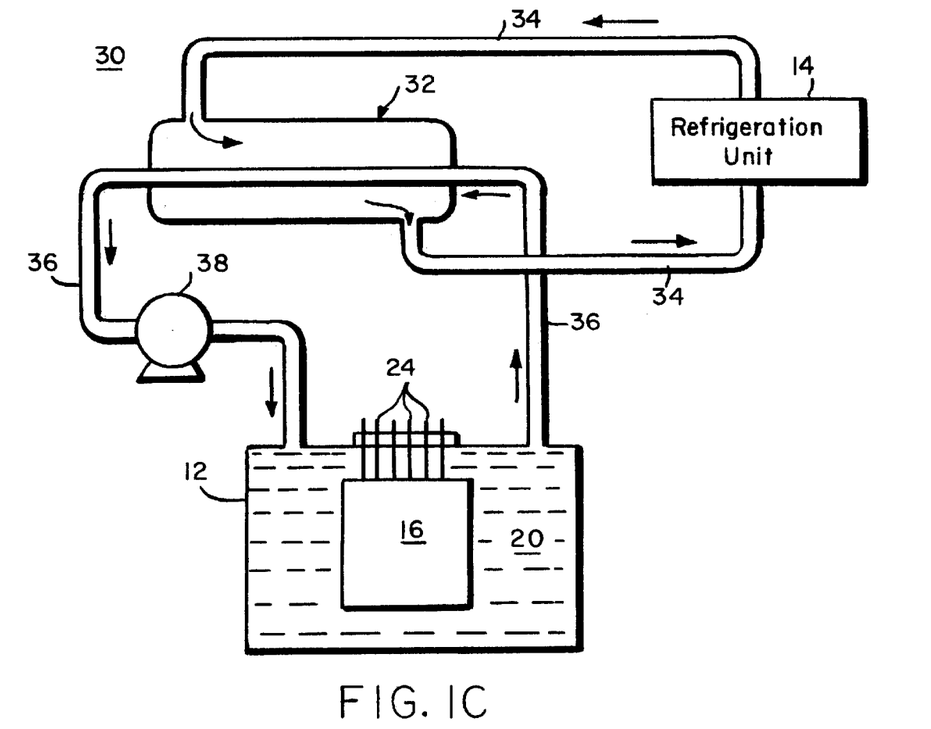
FIG. 1C illustrates a cryogenic cooling system suitable for use in another alternative embodiment of the present invention.

Another alternative embodiment of the invention is shown in FIG. 1C. The embodiment illustrated in FIG. 1C allows cryogen 20 to act a heat transfer medium in system 30. In particular, cryogen 20 is contained in vessel 12 which also contains electronic power conversion apparatus 16. The temperature of cryogen 20 is maintained within a desired range by circulating cryogen 20 through heat exchanger 32 and circulating pump 38 in line 36.

Cryogen 20 is cooled by the cooling medium in line 34. While not to be construed as limiting, the cooling medium could be a fluoroalkane. As further shown in FIG. 1C, the temperature of the cooling medium in line 34 is maintained by refrigeration unit 14. At elevated temperatures, for example when refrigeration is not being utilized, the system is under pressure. This is due to the cryogen being a vapor at room temperature. There may be a two phase condition, depending on the pressure, volume, temperature and the quantity of material in the system. It may therefore be desirable to provide vapor space within the circulating loop, although such space is not necessarily limited to the container housing the electronic assembly.

During normal operation, such as when refrigeration is utilized, it is desirable for the pump to handle the liquid phase rather than the vapor phase.

Figure 2:
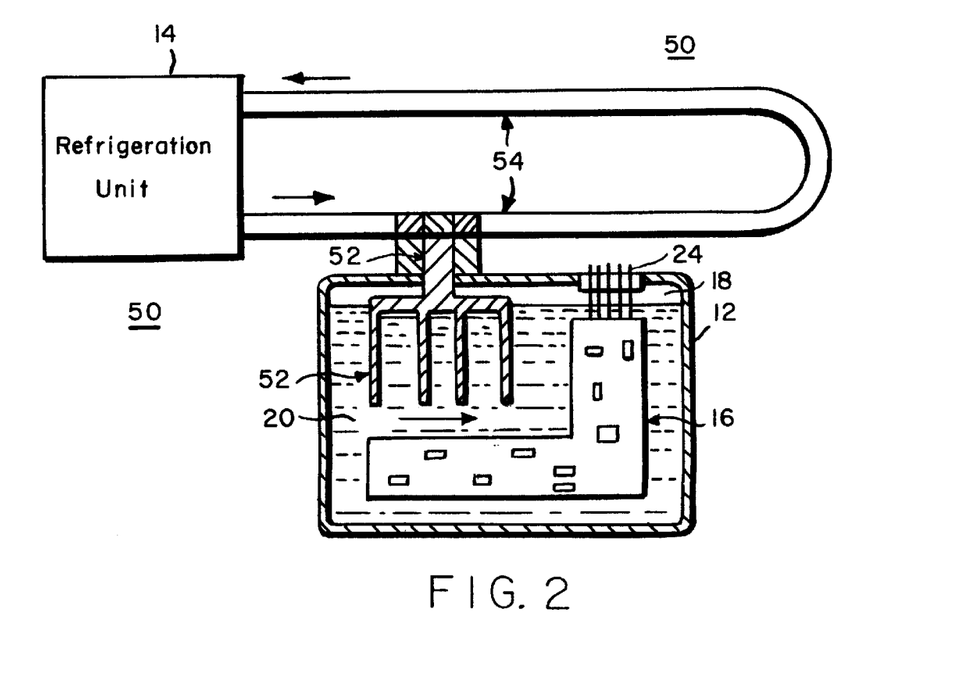
FIG. 2 shows an alternative cooling system arrangement for use according to the present invention.

Another alternative cooling system arrangement for use according to the present invention is shown in FIG. 2. System 50 includes vessel 12 having electronics power conversion apparatus 16 positioned therein. Cryogen 20 is provided in an amount sufficient to cool apparatus 16 to a desired temperature.

System 50, as shown in FIG. 2, also includes metallic cold fingers 52 and refrigeration coil 54. Metallic cold fingers 52 are preferably formed of copper. Metallic cold fingers 52, which cool cryogen 20 in vessel 12, are cooled by refrigeration coil 54. Refrigeration coil 54 is cooled by a refrigeration unit 14. Alternatively, liquid cryogen could be used in place of refrigeration coil 54 to cool metallic cold fingers 52.

As the temperature of cryogen 20 increases, vapor is produced and rises to vapor space 18. Metallic cold fingers 52 are positioned to provide sufficient cooling to vapor in space 18 and to cryogen 20 within vessel 12.

Figure 3:
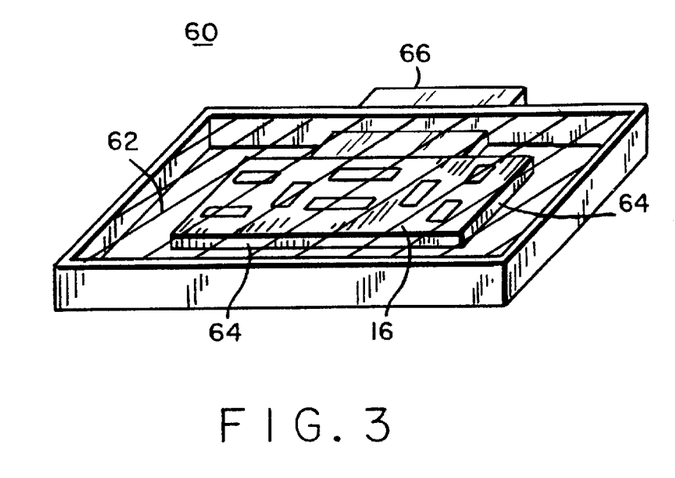
FIG. 3 illustrates another alternative embodiment of a cooling system suitable use with the present invention.

FIG. 3 illustrates another alternative embodiment of a cooling system suitable use with the present invention. System 60 includes an insulated housing 62 (without cryogen) having electronics power conversion apparatus 16 positioned therein. In this embodiment, apparatus 16 includes a thermally conductive substrate 64 disposed on the exterior surfaces of apparatus 16. While not to be construed as limiting, thermally conductive substrate 64 can be formed of copper and electrically insulated from the electronic assembly. Alternatively, substrate 64 can be formed of beryllium oxide or other thermally conductive electrical insulators. Thermally conductive substrate 64 can be utilized to enhance the cooling efficiency of system 60. System 60 also includes metallic cold fingers 66 which may be formed of copper or the like.

Metallic cold fingers 66 function in a manner similar to metallic cold fingers 52 described above in connection with FIG. 2, except that metallic cold fingers 66 are configured to physically contact and cool substrate 64 rather than cryogen 20. In this manner, apparatus 16 is maintained within the desired temperature range. Cryogen 20 (not shown in FIG. 3) can be circulated in a coil (such as coil 54 shown in FIG. 2) to maintain cold fingers 66 within the desired temperature range. It will be appreciated that the apparatus 16 having substrate 64 disposed on the exterior surfaces thereof can also be used in the embodiment shown in FIG. 2.

Figure 4:
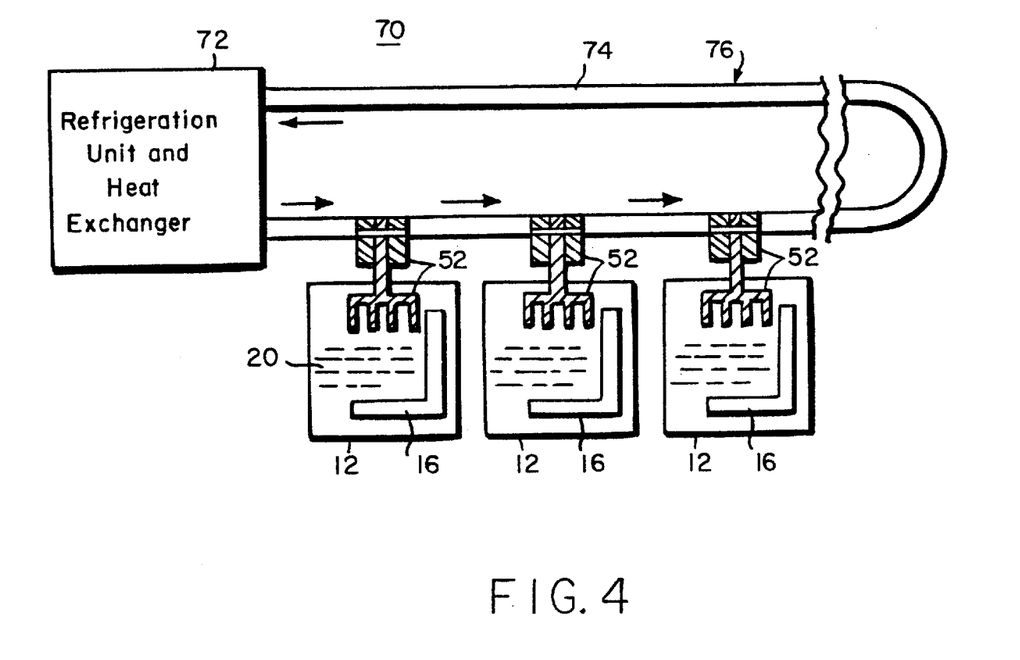
FIG. 4 illustrates a distribution manifold for use with the cooling systems shown in FIGS. 1B, 1C, 2 and 3.

FIG. 4 illustrates a distribution manifold for use with the cooling systems shown in FIGS. 1A, 1B, IC, 2 and 3. The arrangement shown in FIG. 4 provides a system 70 that can cryogenically cool a plurality of apparatus 16. System 70 includes refrigeration unit 72, distribution manifold 74 having cryogen 76 therein. Cryogen 76 provides the appropriate cooling capabilities to metallic cold fingers 52, or cold fingers 66 of FIG. 3.

Vessel 12, as shown in FIG. 4, is similar to the arrangement shown in FIG. 2. It will be appreciated, however, that any of the previously described embodiments such as those in FIGS. 1A, 1B, IC and 3 are suitable for use in system 70. It will also be appreciated that a combination of these embodiments could be implemented for use in system 70. In some instances, for example, it may be desirable to cool an apparatus in accordance with the embodiment shown in FIG. 1B, to cool another apparatus in accordance with the embodiment FIG. 1C, and to cool yet another apparatus in accordance with the embodiment of FIG. 3. In addition, alternative system configurations and arrangements are suitable for use in system 70.

As discussed above, the liquid cryogen may not exhibit nucleate boiling unless a critical heat flux is reached. Under normal conditions below boiling, the liquid will act as a thermal convective heat transfer medium for dissipative power electronic assemblies and components, and is suitable for a number of heat exchange configurations in which the average bulk temperature can be controlled. In one heat exchange configuration, heat may be extracted from the perfluoropropane mixture by immersion of a cold head from a cryogenic cooler or by immersion of a conduit through which passes a cryogenic liquid or vapor at a suitably lower temperature.

In yet another implementation, the perfluoropropane is the heat transfer medium in a heat pipe structure, in which the heat extracted from the dissipative electronic assembly is extracted at the boiling point temperature and is recondensed by a cold head sink at the other end of the heat pipe. If the pressure is lower than atmospheric in the heat pipe due to for example how the heat pipe was filled, the boiling point of the cryogen will be altered and lowered. For instance, if the heat pipe is first evacuated and then back filled with cold liquid, the sealed pressure will be the vapor pressure of the substance at low temperature. This is a very low pressure for the liquid(s) and the boiling point will thus be lowered relative to that at one atmosphere pressure. Accordingly, it will be appreciated that how the container is filled can determine if the embodiment will function in a conductive (see, e.g., FIG. 1A) or in a distillation (see, e.g., FIG. 1B) manner. It should also be appreciated that the boiling point of the cryogen can thus be altered in this manner. If the boiling point of the cryogen at atmospheric pressure is too high, for example, the heat pipe can be back filled as described above. In this manner, the pressure can be reduced and the boiling point of the cryogen can be reduced relative to that at atmospheric pressure.

The optimization of system performance and cost effectiveness suggest that it is desirable to use cryopower circuits at about 150K–180K, particularly in large machines. For example, the coefficient of performance (COP) of coolers (e.g., such as POLYCOLD® coolers available from Polycold Systems, Inc., San Rafael, Calif.) is much greater at 170K than 77K.

As discussed above however, a major disadvantage of prior art cryogenic cooling systems has been a lack of a suitable liquid cryogen operable in a wide range, e.g., from 90K–220K. In addition, the cryogen should be: non-flammable, dielectric, non-toxic, stable, and chemically inert and exhibit near zero ozone depletion potential.

The use of octafluoropropane, for example, satisfies these characteristics and has been found suitable for use in accordance with the present invention such that electronic power conversion apparatus can be cryogenically cooled. Octafluoropropane is commercially available from 3M™ under the name PF-5030. As discussed more fully above, additional fluoroalkanes are also suitable for use in the invention. For example, mixtures of fluorinated alkanes can be formed to grade boiling point and freezing point for easier handling. Decafluoro n-butane (perfluoro n-butane) is commercially available from 3M™ under the name PF-5040. Fluorinated 2,3 and 4 carbon alkanes are gases at 1 atmosphere unless cooled below room temperature. Longer fluorinated alkanes are liquids at room temperature and 1 atm.

It should be appreciated by those skilled in the art that the specific embodiments disclosed above may readily be utilized as a basis for modifying or designing other methods or structures for carrying out the same purpose of the present invention. It should also be realized by those skilled in the art that such equivalent constructions do not depart from the spirit and scope of the invention as set forth in the appended claims.

What is claimed is:

1. A cryogenic cooling system for cryogenically cooling at least one electronic power conversion assembly, the system comprising:
   a closed vessel;
   at least one liquid cryogen comprising a chlorine-free fluorocarbon or a mixture of chlorine-free fluorocarbons within the vessel;
   at least one electronic power conversion apparatus immersed in the at least one liquid cryogen, the at least one electronic power conversion apparatus comprising at least one semiconductor switch and at least one capacitor;
   a cooling coil at least partially immersed in the at least one liquid cryogen and positioned proximate to the at least one electronic power conversion apparatus; and
   input/output means for supplying power to the at least one electronic power conversion apparatus and receiving power from the at least one electronic power conversion apparatus;
   wherein the number of carbons in the fluorocarbon or fluorocarbons is in the range of 2 to 7.

2. The system of claim 1, wherein the at least one semiconductor switch is a MOSFET.

3. The system of claim 1, wherein the cooling coil is finned.

4. A cryogenic cooling system for cryogenically cooling at least one electronic power conversion assembly, the system comprising:
   a closed vessel;
   at least one liquid cryogen comprising a fully halogenated chlorine-free fluoroalkane or a mixture of chlorine-free fluoroalkanes within the vessel;
   at least one electronic power conversion apparatus immersed in the at least one liquid cryogen, the at least one electronic power conversion apparatus comprising at least one semiconductor switch and at least one capacitor;
   a cooling coil at least partially immersed in the at least one liquid cryogen and positioned proximate to the at least one electronic power conversion apparatus; and
   input/output means for supplying power to the at least one electronic power conversion apparatus and receiving power from the at least one electronic power conversion apparatus;
   wherein the fluoroalkane or fluoroalkanes comprise molecules having between 3 and 7 carbons.

5. The system of claim 4, wherein the fluoroalkane or fluoroalkanes is selected from the group consisting of octafluoropropane, decafluoro n-butane decafluoro isobutane, perfluoro npentane, trifluoromethyl butane, perfluoro isopentane, perfluoro n-hexane, trifluoromethyl perfluoro n-pentane, di(trifluoromethyl) perfluoro n-butane, perfluoro n-heptane, trifluoromethyl perfluoro n-hexane, di(trifluoromethyl) perfluoro n-pentane, tri(trifluoromethyl) perfluoro n-butane, and isomers and mixtures thereof.

6. The system of claim 4, wherein the at least one semiconductor switch is a MOSFET.

7. The system of claim 4, wherein the cooling coil is finned.

8. A method for cryogenically cooling at least one electronic power conversion assembly, the method comprising:
   immersing at least one electronic power conversion apparatus comprising at least one semiconductor switch and at least one capacitor in at least one liquid cryogen having a cooling coil at least partially immersed therein such that the at least one electronic power conversion apparatus is proximate to at least a portion of the immersed portion of the cooling coil;
   wherein the at least one liquid cryogen comprises a chlorine-free fluorocarbon or a mixture of chlorine-free fluorocarbons having between 2 and 7 carbons.

9. The method of claim 8, wherein the at least one semiconductor switch is a MOSFET.

10. A method for cryogenically cooling at least one electronic power conversion assembly, the method comprising:
    immersing at least one electronic power conversion apparatus comprising at least one semiconductor switch and at least one capacitor in at least one liquid cryogen having a cooling coil at least partially immersed therein such that the at least one electronic power conversion apparatus is proximate to at least a portion of the immersed portion of the cooling coil;
    wherein the at least one liquid cryogen comprises a fully halogenated chlorine-free fluoroalkane or a mixture of chlorine-free fluoroalkane having between 3 and 7 carbons.

11. The method of claim 10, wherein the fluoroalkane or fluoroalkanes is selected from the group consisting of octafluoropropane, decafluoro n-butane decafluoro isobutane, perfluoro npentane, trifluoromethyl butane, perfluoro isopentane, perfluoro n-hexane, trifluoromethyl perfluoro n-pentane, di(trifluoromethyl) perfluoro n-butane, perfluoro n-heptane, trifluoromethyl perfluoro n-hexane, di(trifluoromethyl) perfluoro n-pentane, tri(trifluoromethyl) perfluoro n-butane, and isomers and mixtures thereof.

12. The method of claim 10, wherein the at least one semiconductor switch is a MOSFET.

13. A cryogenic cooling system for cryogenically cooling at least one electronic power conversion assembly, the system comprising:
    a housing;
    at least one electronic power conversion apparatus positioned in the housing, the at least one electronic power conversion apparatus comprising at least one semiconductor switch and at least one capacitor, the at least one electronic power conversion apparatus further comprising a thermally conductive substrate disposed on at least a portion of exterior surfaces of the at least one electronic power conversion apparatus;
    a plurality of metallic cold fingers in physical contact with the substrate and configured to cool the substrate when the plurality of metallic cold fingers are in contact with a cooling source comprising at least one liquid cryogen contained within a circulation coil exterior to the housing and in contact with at least a portion of the plurality of metallic cold fingers; and input/output means for supplying power to the at least one electronic power conversion apparatus and receiving power from the at least one electronic power conversion apparatus;

wherein the at least one cryogen comprises a cryogen selected from the group consisting of octafluoropropane, decafluoro n-butane, decafluoro isobutane, perfluoro npentane, trifluoromethyl butane, perfluoro isopentane, perfluoro n-hexane, trifluoromethyl perfluoro n-pentane, di(trifluoromethyl) perfluoro n-butane, perfluoro n-heptane, trifluoromethyl perfluoro n-hexane, di(trifluoromethyl) perfluoro n-pentane, tri(trifluoromethyl) perfluoro n-butane, and isomers and mixtures thereof.

14. The system of claim 13, wherein the circulation coil is connected to a refrigeration unit.

15. A cryogenic cooling system for cryogenically cooling at least one electronic power conversion assembly, the system comprising:

a housing;

at least one electronic power conversion apparatus positioned in the housing, the at least one electronic power conversion apparatus comprising at least one semiconductor switch and at least one capacitor, the at least one electronic power conversion apparatus further comprising a thermally conductive copper substrate disposed on at least a portion of exterior surfaces of the at least one electronic power conversion apparatus;

a plurality of metallic cold fingers in physical contact with the substrate and configured to cool the substrate when the plurality of metallic cold fingers are in contact with a cooling source; and input/output means for supplying power to the at least one electronic power conversion apparatus and receiving power from the at least one electronic power conversion apparatus;

wherein the at least one cryogen comprises a cryogen selected from the group consisting of octafluoropropane, decafluoro n-butane, decafluoro isobutane,perfluoro npentane, trifluoromethyl butane, perfluoro isopentane, perfluoro n-hexane, trifluoromethyl perfluoro n-pentane, di(trifluoromethyl) perfluoro n-butane, perfluoro n-heptane, trifluoromethyl perfluoro n-hexane, di(trifluoromethyl) perfluoro n-pentane, tri(trifluoromethyl) perfluoro n-butane, and isomers and mixtures thereof.

16. The system of claim 15, wherein the at least one liquid cryogen is contained within a circulation coil.

17. A cryogenic cooling system for cryogenically cooling at least one electronic power conversion assembly, the system comprising:

a housing;

at least one electronic power conversion apparatus positioned in the housing, the at least one electronic power conversion apparatus comprising at least one semiconductor switch and at least one capacitor, the at least one electronic power conversion apparatus further comprising a thermally conductive beryllium oxide substrate disposed on at least a portion of exterior surfaces of the at least one electronic power conversion apparatus;

a plurality of metallic cold fingers in physical contact with the substrate and configured to cool the substrate when the plurality of metallic cold fingers are in contact with a cooling source; and input/output means for supplying power to the at least one electronic power conversion apparatus and receiving power from the at least one electronic power conversion apparatus;

wherein the at least one cryogen comprises a cryogen selected from the group consisting of octafluoropropane, decafluoro n-butane, decafluoro isobutane,perfluoro npentane, trifluoromethyl butane, perfluoro isopentane, perfluoro n-hexane, trifluoromethyl perfluoro n-pentane, di(trifluoromethyl) perfluoro n-butane, perfluoro n-heptane, trifluoromethyl perfluoro n-hexane, di(trifluoromethyl) perfluoro n-pentane, tri(trifluoromethyl) perfluoro n-butane, and isomers and mixtures thereof.

18. The system of claim 17, wherein the at least one liquid cryogen is contained within a circulation coil.

19. A cryogenic cooling system for cryogenically cooling at least one electronic power conversion assembly, the system comprising:

a housing;

at least one electronic power conversion apparatus positioned in the housing, the at least one electronic power conversion apparatus comprising at least one semiconductor switch and at least one capacitor, the at least one electronic power conversion apparatus further comprising a thermally conductive substrate disposed on at least a portion of exterior surfaces of the at least one electronic power conversion apparatus;

a plurality of metallic copper cold fingers in physical contact with the substrate and configured to cool the substrate when the plurality of metallic cold fingers are in contact with a cooling source; and input/output means for supplying power to the at least one electronic power conversion apparatus and receiving power from the at least one electronic power conversion apparatus;

wherein the at least one cryogen comprises a cryogen selected from the group consisting of octafluoropropane, decafluoro n-butane, decafluoro isobutane,perfluoro n-pentane, trifluoromethyl butane, perfluoro isopentane, perfluoro n-hexane, trifluoromethyl perfluoro n-pentane, di(trifluoromethyl) perfluoro n-butane, perfluoro n-heptane, trifluoromethyl perfluoro n-hexane, di(trifluoromethyl) perfluoro n-pentane, tri(trifluoromethyl) perfluoro n-butane, and isomers and mixtures thereof.

20. The system of claim 19, wherein the at least one liquid cryogen is contained within a circulation coil.

* * * * *